(12) United States Patent
Mehta et al.

(10) Patent No.: US 11,513,879 B2
(45) Date of Patent: Nov. 29, 2022

(54) DETECTION AND MITIGATION FOR SOLID-STATE STORAGE DEVICE READ FAILURES DUE TO WEAK ERASE

(71) Applicant: Seagate Technology LLC, Fremont, CA (US)

(72) Inventors: Darshana H. Mehta, Shakopee, MN (US); Antoine Khoueir, Mound, MN (US)

(73) Assignee: Seagate Technologies LLC, Fremont, CA (US)

( * ) Notice: Subject to any disclaimer, the term of this patent is extended or adjusted under 35 U.S.C. 154(b) by 613 days.

(21) Appl. No.: 16/427,502

(22) Filed: May 31, 2019

(65) Prior Publication Data

US 2020/0264944 A1  Aug. 20, 2020

Related U.S. Application Data

(60) Provisional application No. 62/808,006, filed on Feb. 20, 2019.

(51) Int. Cl.
| | |
|---|---|
| G06F 11/00 | (2006.01) |
| G06F 11/07 | (2006.01) |
| G11C 16/14 | (2006.01) |
| G11C 16/34 | (2006.01) |
| G11C 16/26 | (2006.01) |

(Continued)

(52) U.S. Cl.
CPC ........ *G06F 11/076* (2013.01); *G06F 11/0727* (2013.01); *G06F 11/0793* (2013.01); *G06F 11/1068* (2013.01); *G11C 16/14* (2013.01); *G11C 16/26* (2013.01); *G11C 16/3445* (2013.01); *G11C 16/0483* (2013.01)

(58) Field of Classification Search
CPC ............... G06F 11/076; G06F 11/0727; G06F 11/0793; G06F 11/1068; G06F 11/0754; G06F 11/0751; G06F 11/079
See application file for complete search history.

(56) References Cited

U.S. PATENT DOCUMENTS

| | | | |
|---|---|---|---|
| 6,222,772 B1 | 4/2001 | Choi et al. | |
| 7,408,810 B2 | 8/2008 | Aritome et al. | |

(Continued)

FOREIGN PATENT DOCUMENTS

WO  WO 2015155860  10/2015

*Primary Examiner* — Katherine Lin
(74) *Attorney, Agent, or Firm* — Taylor English Duma LLP

(57) ABSTRACT

Weak erase detection and mitigation techniques are provided that detect permanent failures in solid-state storage devices. One exemplary method comprises obtaining an erase fail bits metric for a solid-state storage device; and detecting a permanent failure in at least a portion of the solid-state storage device causing weak erase failure mode by comparing the erase fail bit metric to a predefined fail bits threshold. In at least one embodiment, the method also comprises mitigating for the permanent failure causing the weak erase failure mode for one or more cells of the solid-state storage device. The mitigating for the permanent failure comprises, for example, changing a status of the one or more cells to a defective state and/or a retired state. The detection of the permanent failure causing the weak erase failure mode comprises, for example, detecting the weak erase failure mode without an erase failure.

12 Claims, 15 Drawing Sheets

(51) Int. Cl.
  *G06F 11/10* (2006.01)
  *G11C 16/04* (2006.01)

(56) References Cited

U.S. PATENT DOCUMENTS

| | | |
|---|---|---|
| 8,670,285 B2 | 3/2014 | Dong et al. |
| 9,001,589 B2 | 4/2015 | Baek |
| 9,607,707 B1 | 3/2017 | Pang et al. |
| 2016/0111164 A1 | 4/2016 | Chen et al. |
| 2016/0125956 A1 | 5/2016 | Magia et al. |
| 2018/0122489 A1* | 5/2018 | Ray .................. G11C 16/3445 |
| 2019/0180832 A1* | 6/2019 | Rori .................. G11C 16/3477 |

* cited by examiner

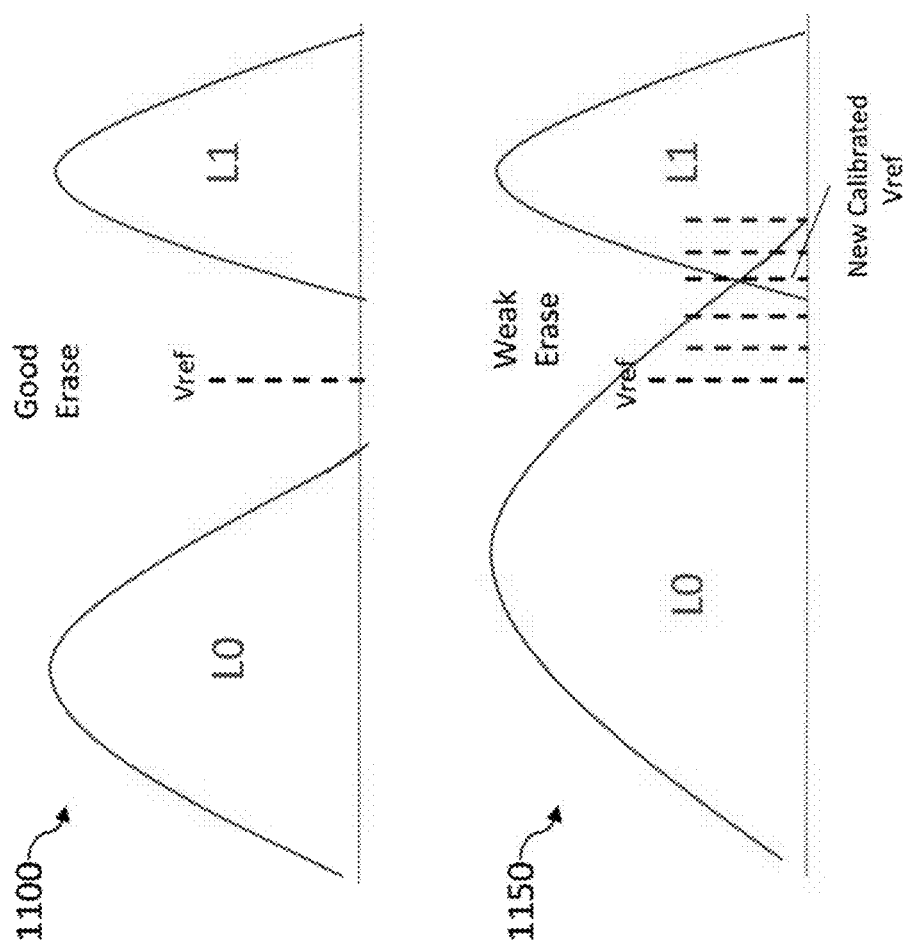

1300

Step 1
Determine PFB = f (EFB) during component evaluation.
- Component Evaluation needs to include "Weak Erase" samples
- Linear function example shown in FIG. 1
  PFB = m * EFB + C    (i)
  where m, c are constants Step 2.A
Establish acceptable fail bits $PFB_{Factory}$ based on required Infant Mortality BER and applicable ECC Step 2.B
Establish acceptable fail bits $PFB_{Retirement}$ based on applicable ECC during Flash Life Step 3
Determine $EFB_{Factory}$, $EFB_{Retirement}$ Thresholds by substituting 2.A and 2.B in Equation (i)

FIG. 13

DETECTION AND MITIGATION FOR SOLID-STATE STORAGE DEVICE READ FAILURES DUE TO WEAK ERASE

CROSS-REFERENCE TO RELATED APPLICATION(S)

The present application claims priority to U.S. Provisional Patent Application Ser. No. 62/808,006, filed Feb. 20, 2019, entitled "Detection and Mitigation for Solid State Storage Device Read Failures Due to Weak Erase," incorporated by reference herein in its entirety.

SUMMARY

In one embodiment, a method comprises obtaining an erase fail bits metric for a solid-state storage device; and detecting a permanent failure in at least a portion of the solid-state storage device causing weak erase failure mode by comparing the erase fail bit metric to a predefined fail bits threshold. In at least one embodiment, the method also comprises the step of mitigating for the permanent failure causing the weak erase failure mode for one or more cells of the solid-state storage device.

In some embodiments, the mitigating for the permanent failure comprises changing a status of the one or more cells of the solid-state storage device to a defective state and/or a retired state, for example, at a page level resolution. The detection of the permanent failure causing the weak erase failure mode comprises, for example, detecting the weak erase failure mode without an erase failure.

Other illustrative embodiments include, without limitation, apparatus, systems, controllers, methods and computer program products comprising processor-readable storage media.

BRIEF DESCRIPTION OF THE DRAWINGS

FIG. 11 illustrates voltage distributions associated with a page calibration mitigation technique for read failures, for a good erase operation and a weak erase operation, respectively, according to one or more embodiments of the disclosure;

FIG. 13 illustrates exemplary pseudo code for a process for determining the erase fail bits thresholds in accordance with the techniques of FIG. 12, according to one embodiment of the disclosure.

DETAILED DESCRIPTION

Figure 1:
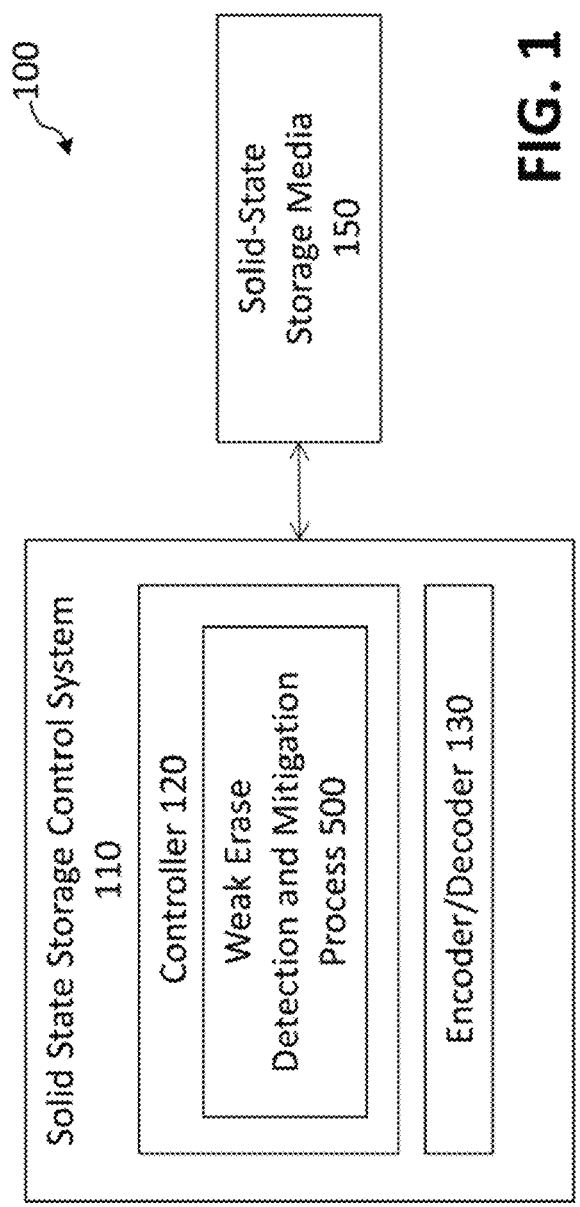
FIG. 1 is a schematic block diagram of an illustrative solid-state storage system, in accordance with one or more embodiments of the present disclosure.

Illustrative embodiments will be described herein with reference to exemplary solid-state storage devices and associated storage media, controllers, and other processing devices. It is to be appreciated, however, that these and other embodiments are not restricted to the particular illustrative system and device configurations shown. Accordingly, the term "solid-state storage device" as used herein is intended to be broadly construed, so as to encompass, for example, any storage device implementing the weak erase detection and mitigation techniques described herein. Numerous other types of storage systems are also encompassed by the term "solid-state storage device" as that term is broadly used herein.

In one or more embodiments, weak erase detection and mitigation techniques are provided. "Weak Erase" (also referred to as "Shallow Erase") is a common failure mode for NAND Flash devices (2D/3D), and other solid-state memory devices, which may or may not result in erase or program errors. Weak erase without an erase/program error can result in an Uncorrectable Error Correction Code (UECC) read error at the system level. Thus, techniques are needed to detect such weak erase errors even when there is not a program or erase error.

In some embodiments, the disclosed weak erase detection and mitigation techniques detect permanent failures in at least portions of the solid-state storage device causing weak erase failures each time that portion of the solid-state storage device is erased by comparing an erase fail bit metric to a predefined fail bits threshold. The phrase "permanent failure" shall be broadly construed and comprises, for example, a failure caused by a failure mode that does not disappear across erase cycles (and hence is expected to be repeatable across program/erase cycles). In addition, a permanent failure will repeat on the same location (e.g., a die, block, or page) across program/erase cycles.

In addition, the permanent failure causing weak erase failure mode are mitigated for one or more cells of the solid-state storage device. For example, the mitigation for the permanent failure comprises changing a status of the one or more cells of the solid-state storage device to a defective state and/or a retired state. In a further variation, the permanent failure in the solid-state storage device causing weak erase failure mode is detected without an erase failure.

The weak erase can cause an error in the data stored by the cell, and negatively impact the performance of the NAND Flash memory device.

In addition, the Uncorrectable Bit Error Rate (UBER) of a NAND memory device can be impacted due to a "weak erase" failure mode, if the weak erase condition is not handled at NAND level or system level using the disclosed weak erase detection and mitigation techniques. One or more aspects of the present disclosure focus on "weak" erase failures caused by a permanent failure mode, such as "Leakage Current," or a "Physical Random Defect," as opposed to a transient failure mode caused due to failure modes such as "Open Block," "Disturb," or "Retention." A permanent failure mode persists on or after a subsequent erase operation, whereas a transient failure mode disappears after an erase operation.

Weak erase can be caused by, for example:

NAND flash design for life extension, causing a systematic impact;

a physical defect on the NAND device, causing an impact specific to a die, block and/or page; and/or NAND "internal" leakage during an erase operation, causing an impact that is specific to a die, block and/or page (or pages; in many cases two subsequent pages in a physical wordline).

Thus, detecting weak erase and applying a corresponding system level mitigation using the disclosed techniques is important for preventing data loss.

FIG. 1 is a schematic block diagram of an illustrative solid-state storage system 100. As shown in FIG. 1, the illustrative solid-state memory system 100 comprises a solid-state storage control system 110 and a solid-state storage media 150. The exemplary solid-state storage control system 110 comprises a controller 120 and an encoder/decoder block 130. In an alternative embodiment, the encoder/decoder block 130 may be implemented inside the controller 120.

As shown in FIG. 1, the controller 120 comprises a weak erase detection and mitigation process 500, discussed below in conjunction with FIG. 5, to implement the weak erase detection and mitigation techniques described herein. The encoder/decoder block 130 may be implemented, for example, using well-known commercially available techniques and/or products. The encoder within the encoder/decoder block 130 may implement, for example, error correction encoding, such as a low-density parity-check (LDPC) encoding. The decoder within the encoder/decoder block 130 may be embodied, for example, as a hard decision decoder, such as a hard decision low-density parity-check (HLDPC) decoder.

The solid-state storage media 150 comprises a memory array, such as a single-level or multi-level cell flash memory, a NAND flash memory, a phase-change memory (PCM), a magneto-resistive random access memory (MRAM), a nano RAM (NRAM), a NOR (Not OR) flash memory, a dynamic RAM (DRAM) or another non-volatile memory (NVM). While the disclosure is illustrated primarily in the context of a solid-state storage device (SSD), the disclosed weak erase detection and mitigation techniques can be applied in solid-state hybrid drives (SSHD) and other storage devices, as would be apparent to a person of ordinary skill in the art based on the present disclosure.

Figure 2:
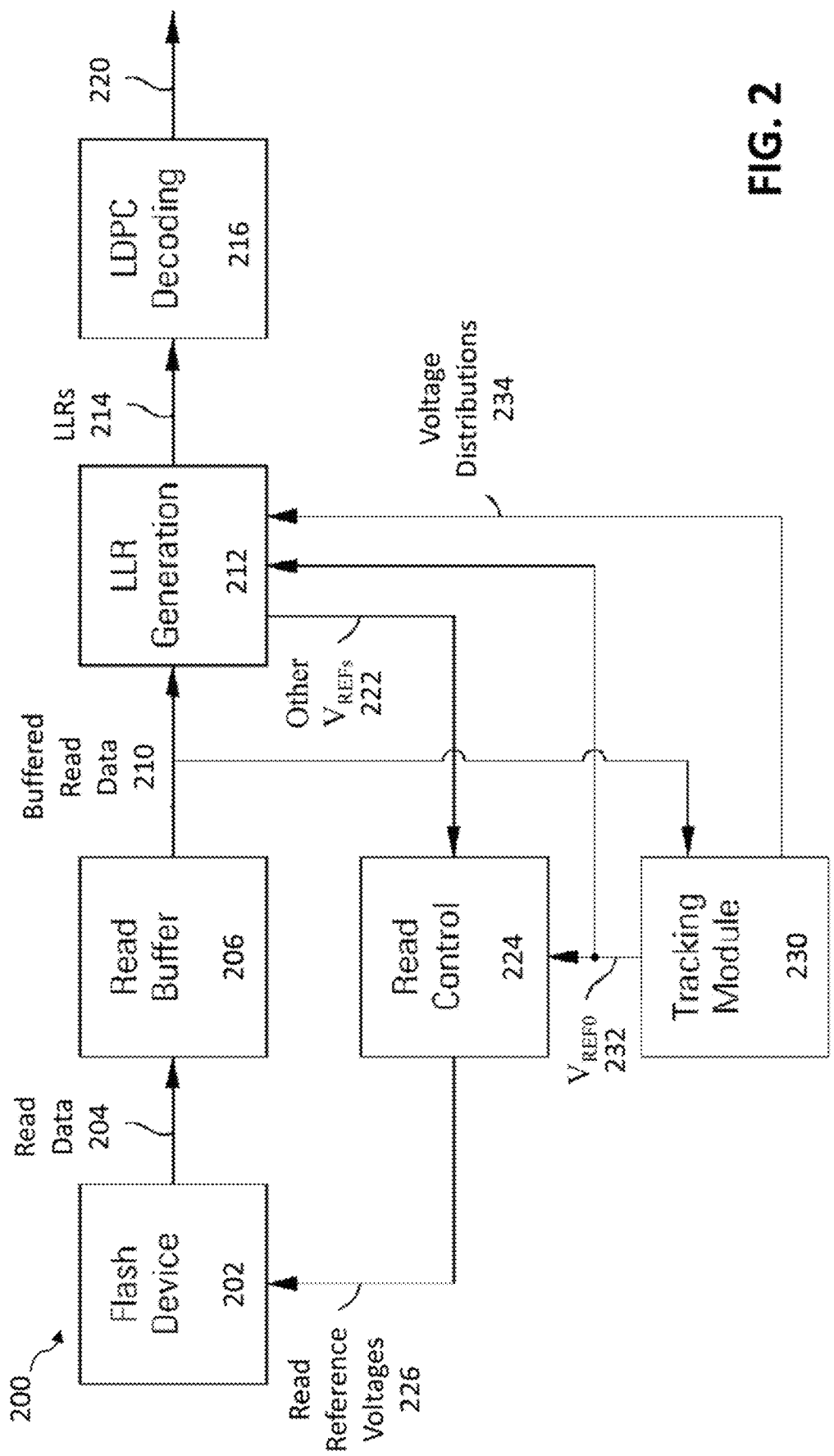
FIG. 2 illustrates a flash channel read path with read reference voltage tracking, in accordance with some embodiments of the present disclosure.

FIG. 2 illustrates a flash channel read path 200 with channel tracking-based read retry voltage adjustment in accordance with some embodiments of the present disclosure. The read path 200 includes a flash device 202 having an array of memory cells, or another type of non-volatile memory. Based upon the disclosure provided herein, one of ordinary skill in the art will recognize a variety of storage technologies that can benefit from the weak erase detection and mitigation techniques disclosed herein.

Read reference voltages 226 are applied to the flash device 202 by a read control device 224 in a series of N reads. Each memory cell is read N times, and the N reads result in read data 204 containing N bits per memory cell as a quantized version of the stored voltage on the memory cell. The read data 204 is buffered in a read buffer 206, and buffered read data 210 from read buffer 206 is provided to a log likelihood ratio (LLR) generation circuit 212 (or likelihood generator, which can also be adapted to use plain likelihood values). The N bits for a memory cell are mapped to log likelihood ratios 214 for the memory cell in log likelihood ratio generation circuit 212. In some embodiments, the log likelihood ratio generation circuit 212 contains a lookup table that maps the read patterns in buffered read data 210 to log likelihood ratios 214.

A tracking module 230 receives the buffered read data 210 from the read buffer 206, or from any other suitable source. Generally, channel tracking techniques adapt to the changes in read reference voltages to maintain a desired performance level. Adaptive tracking algorithms typically track variations in the solid-state storage channel and consequently, help to maintain a set of updated channel parameters. The updated channel parameters are used, for example, to adjust read reference voltages. United States Published Patent Application No. 2013/0343131, filed Jun. 26, 2012, entitled "Fast Tracking for Flash Channels," and/or United States Published Patent Application No. 2015/0287453, entitled "Optimization of Read Thresholds for Non-Volatile Memory," (now U.S. Pat. No. 9,595,320) incorporated by reference herein in their entirety, disclose techniques for adapting read reference voltages.

The tracking module 230 identifies the intersection point between neighboring voltage distributions for a memory cell, in a known manner, and provides read reference voltage level $V_{REF0}$ 232, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation, and additional read reference voltages around $V_{REF0}$ to obtain substantially all possible log likelihood ratio values. The tracking module 230 thus generates the read reference voltage level $V_{REF0}$ 232 to be used in read retry operations. In other embodiments, $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 212 and 224.

The tracking module 230 also tracks the voltage distributions 234. In some embodiments, the tracking module 230 calculates the voltage distribution means and variances for each voltage distribution 234 corresponding to each possible state in each memory cell. The voltage distributions 234 can be calculated in any suitable manner based on the read data. As an example, the tracking module 230 can operate as disclosed in U.S. Published Patent Application No. 2013/0343131, filed Jun. 26, 2012, entitled "Fast Tracking for Flash Channels," incorporated by reference herein in its entirety. In some embodiments, the tracking module 230 tracks intersections without estimating means or variances.

For a two-state memory cell, or single-level memory cell, the tracking module 230 estimates the means and variances of the voltage distributions of states "1" and "0", as well as the read reference voltage $V_{REF0}$ that most reduces the bit error rate and which likely lies at the intersection of those distributions, in a known manner.

The tracking module 230 provides the voltage distributions 234 to the log likelihood ratio generation circuit 212 for use in updating the log likelihood ratio lookup table. The log likelihood ratio generation circuit 212 is used to calculate likelihood ratios 214 for decoding by an LDPC (low-density parity-check) decoder 216 that generates decoded data 220. The log likelihood ratio generation circuit 212 also determines where to place the other N−1 read reference voltages around $V_{REF0}$ 232 based on the voltage distributions 234 and on the read reference voltage $V_{REF0}$ 232 to obtain substantially all possible log likelihood ratio values when the read patterns in buffered read data 210 are mapped to log likelihood ratios. The log likelihood ratio generation circuit 212 determines where to place the other N−1 read reference voltages around $V_{REF0}$ 232, updates the lookup table, and provides the N−1 read reference voltage levels 222 to a read controller 224. It is important to note that the division of functionality is not limited to the example embodiments disclosed herein. For example, in other embodiments, the tracking module 230 calculates and provides read reference voltages around $V_{REF0}$ 232 and provides those voltages to the log likelihood ratio generation circuit 212, rather than the log likelihood ratio generation circuit 212 determining where to place the other N−1 read reference voltages around $V_{REF0}$ 232, and these divisions of functionality are to be seen as equivalent.

The read reference voltages are stored in log likelihood ratio generation circuit 212 in some embodiments, as calculated based on the log likelihood ratio lookup table in log likelihood ratio generation circuit 212 and on the voltage distribution means and variances 234 from tracking module 230.

The read controller 224 controls read retry operations in the flash device 202, providing each of the N read reference voltages (including $V_{REF0}$ 232) to be used when reading the memory cells in the flash device 202. The read controller 224 initiates N reads of a page, with the first read using read reference voltage $V_{REF0}$ in some embodiments, and with the subsequent N−1 reads at read reference voltages around $V_{REF0}$ as determined by log likelihood ratio generation circuit 212.

Figure 3:
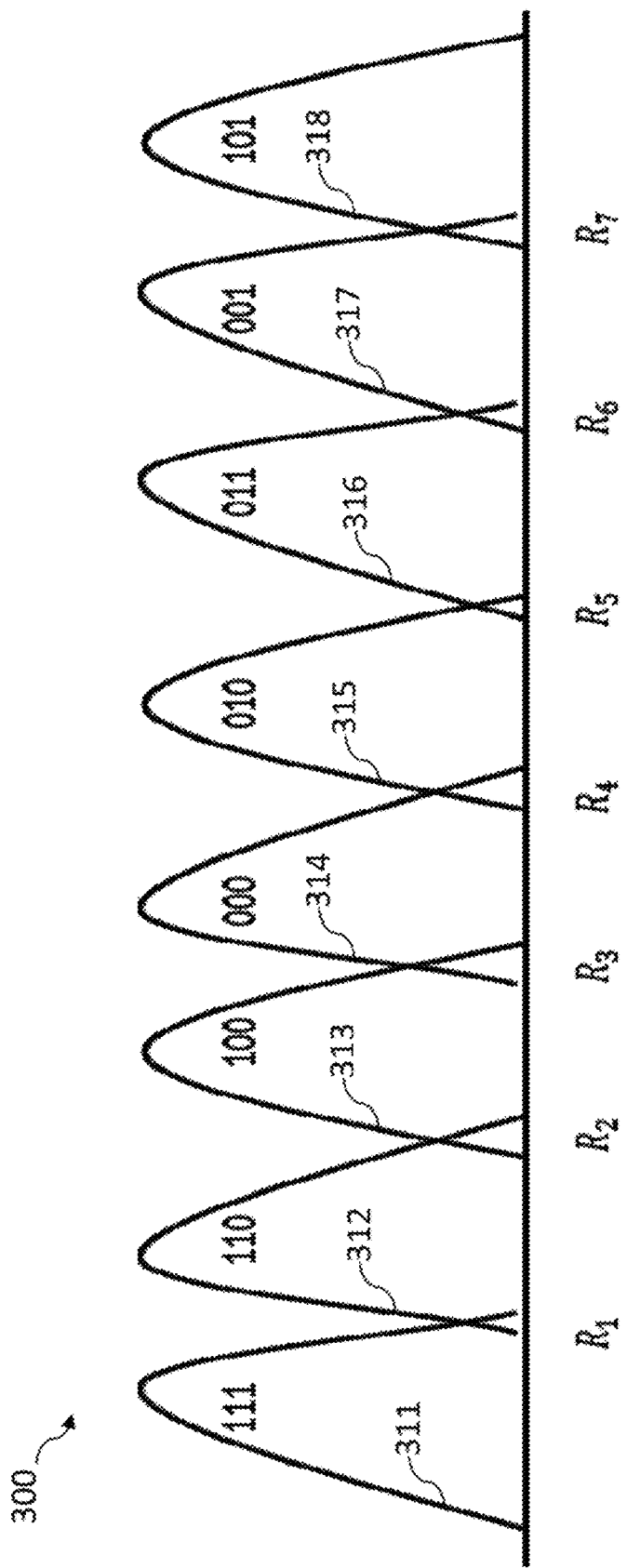
FIG. 3 is a graph of cell voltage distributions for a normal hard decision read operation in a solid-state memory device, in accordance with some embodiments of the present disclosure.

FIG. 3 is a graph 300 of cell voltage distributions 311 through 318 for a normal hard decision read operation in a TLC flash memory device, in accordance with some embodiments of the present disclosure. The exemplary TLC flash memory device is a BiCS3 NAND flash memory from Toshiba Memory America, Inc. Other flash memory types and architectures can be employed, as would be apparent to a person of ordinary skill in the art, without departing from the present invention. The resulting voltages read from the memory cell thus appear something like the distributions 311-318 shown in the graph 300 of FIG. 3, rather than eight distinct discrete voltage levels corresponding to the eight states 111, 110, 100, 000, 010, 011, 001, 101 at the corresponding target state voltage levels. Each distribution 311-318 will have a mean roughly equal to the target voltage for the respective state, and the variance will depend upon the noise. Because the voltages on the memory cell are not accurate, the voltages read back can vary according to the distributions 311-318. In some embodiments, during the initial read of the memory cell, reference voltages $R_i$ (i=1, 2, ..., 7) (e.g., $R_1$ through $R_7$) are used during a read to determine the state of the memory cell, returning hard decisions about the state of the memory cell.

For example, in general, if the read voltage is below reference voltage $R_1$, a decision indicates that the memory cell is determined to be in state 111. If the read voltage is above reference voltage $R_1$ and below reference voltage $R_2$, a decision indicates that the memory cell is determined to be in state 110, and so on.

The first, second, and third bits in a given state are often referred to as the most significant bits, center significant bits, and least significant bits (MSB, CSB, LSB), respectively. In some embodiments, the read operation is divided into a process of reading LSB pages, center significant bit (CSB) pages and most significant bit (MSB) pages. States 111, 011, 001 and 101, for example, correspond to a least significant bit value of 1, and states 110, 100, 000 and 010 correspond to a least significant bit value of 0. When reading the least significant bit, for example, the reference voltages $R_1$ and $R_5$ are applied to the memory cell to obtain the least significant bit, for the exemplary Toshiba TLC NAND device.

While FIG. 3 illustrates the cell voltage distributions for a TLC flash memory, the disclosed read parameter prediction techniques can be applied to SLC, MLC, QLC, etc. and other flash memory systems, as would be apparent to a person of ordinary skill in the art.

For each $R_i$ shown in FIG. 3, a pair ($V_{oi}$, $P_i$) can be derived for each page number, where $V_{oi}$ is the substantially optimal reference voltage that substantially minimizes the bit error rate, and $P_i$ is the corresponding page number.

Weak Erase Detection and Mitigation Techniques

Figure 4:
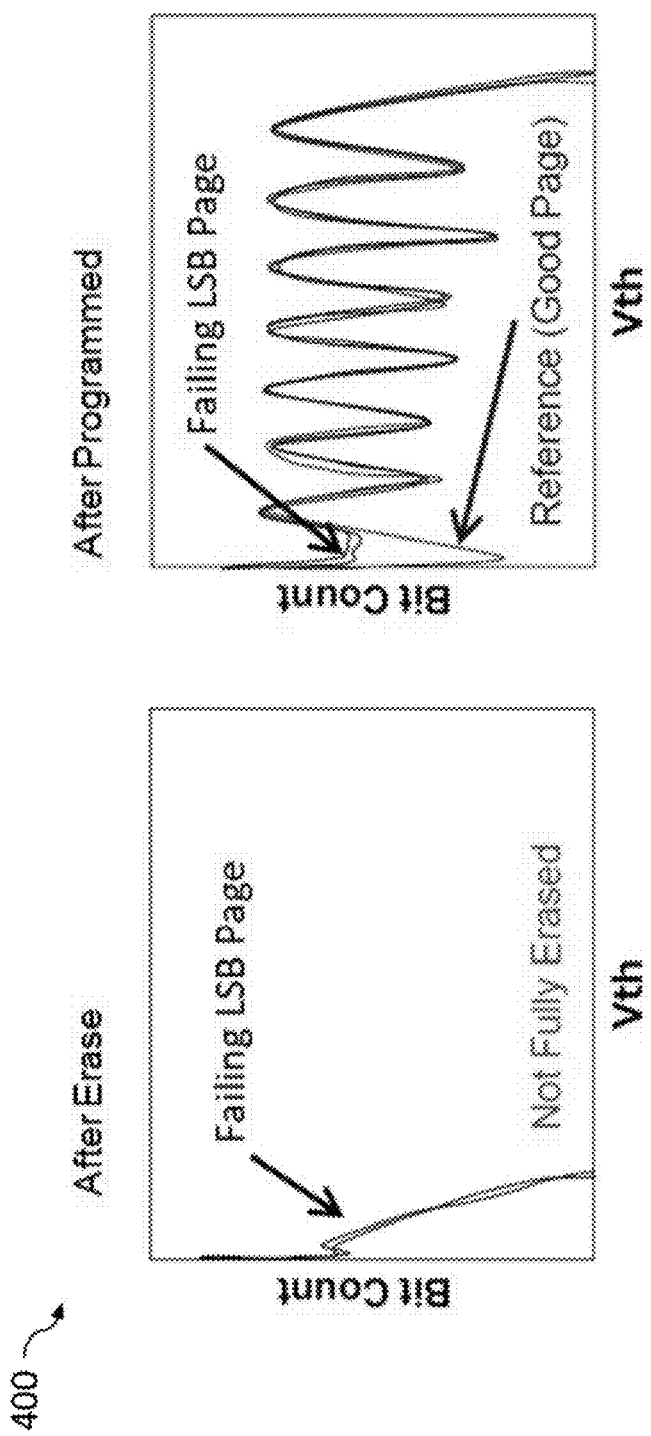
FIG. 4 illustrates bit counts as a function of the threshold voltage distributions for exemplary pages exhibiting "weak erase" symptoms, according to some embodiments.

FIG. 4 illustrates bit counts as a function of the threshold voltage distributions 400 for exemplary pages exhibiting "weak erase" symptoms, according to some embodiments. As shown in FIG. 4, the weak erase condition results in overlapped States for States L0 (Erased) and L1 (Programmed), for example. The weak erase condition may not result in erase or program errors. Typically, the weak erase failure manifests itself into UECC read errors on LSB pages (or whichever Page Type corresponds to a Read level between an Erase state and an adjacent Program state). The term "LSB page(s)," as used herein, shall be broadly construed to refer to a Page Type corresponding to a Read level between an Erase state and an adjacent Program state, depending on the flash type of a given NAND device.

Figure 5:
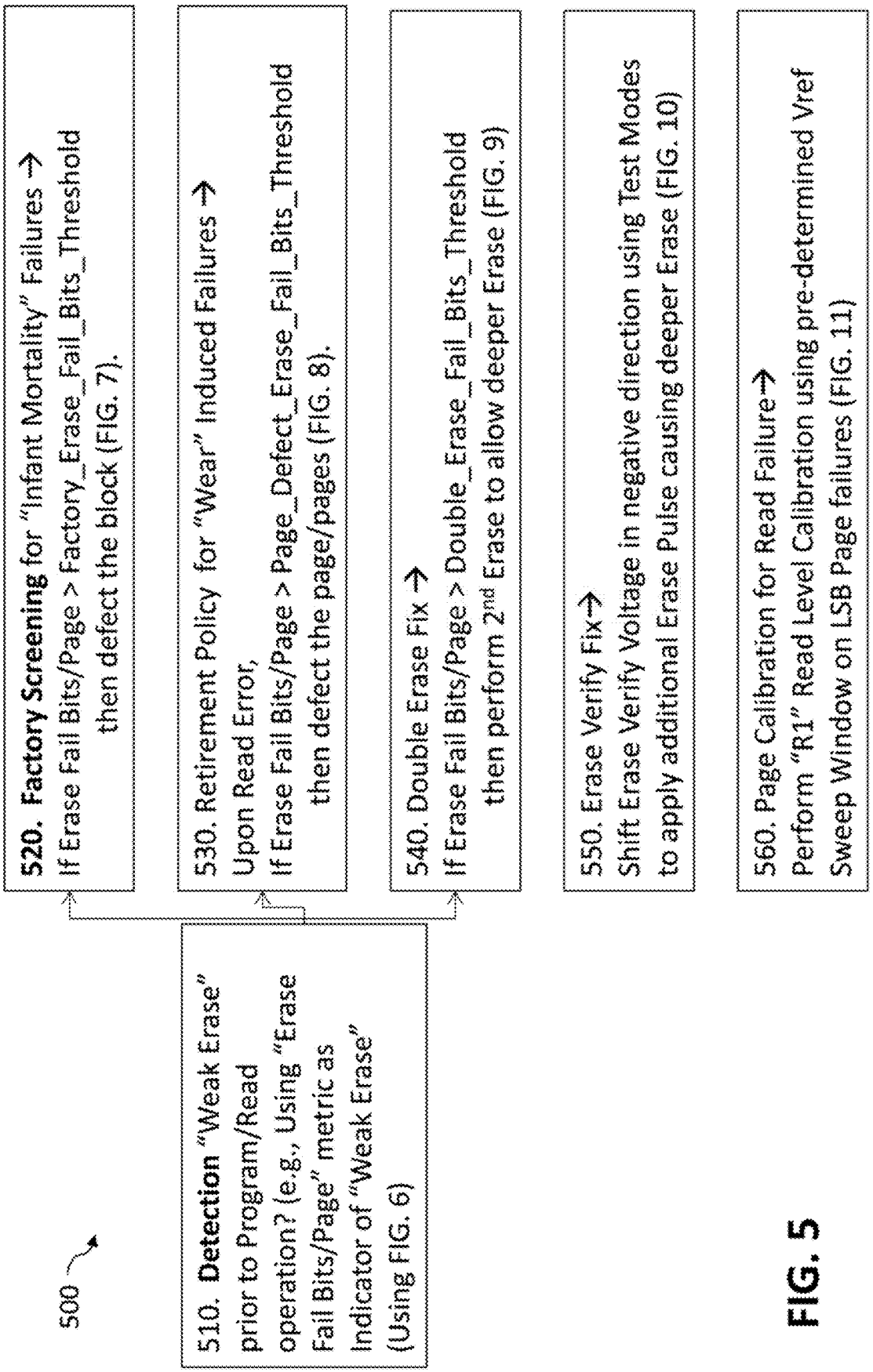
FIG. 5 is a flow chart illustrating an exemplary implementation of a weak erase detection and mitigation process, according to one embodiment of the disclosure.

FIG. 5 is a flow chart illustrating an exemplary implementation of a weak erase detection and mitigation process 500, according to one embodiment of the disclosure. As shown in FIG. 5, the exemplary weak erase detection and mitigation process 500 initially performs a weak erase detection during step 510. Generally, the weak erase detection is performed prior to a program and/or read operation or after a first occurrence of a read failure requiring an outer code (OCR). In some embodiments, an Erase Fail Bits (EFB) per page metric is used as an indicator of a weak erase condition, as discussed further below in conjunction with FIG. 6.

In one or more embodiments, the exemplary EFB threshold is determined, as follows:

EFB=Erase Fail Bits (e.g., using FIG. 6, discussed below); and

PFB=Programmed Fail Bits (e.g., raw bit flips—bits read in error following programming).

First, PFB is determined:

PFB=f (EFB) (e.g., correlation, as discussed further below in conjunction with FIG. 12) for every NAND type during NAND Testing which needs to include Weak Erase samples.

Then, the EFB threshold can be determined based on an acceptable PFB based on available ECC and screening/defecting criterion, as would be apparent to a person of ordinary skill in the art.

During step 520, the exemplary weak erase detection and mitigation process 500 implements an infant mortality screening process 700, as discussed further below in conjunction with FIG. 7, to perform the factory screening for "infant mortality" failures. Generally, if the erase fail bits per page exceeds a predefined factory_erase_fail_bits_threshold, then the block is defected.

During step 530, the exemplary weak erase detection and mitigation process 500 implements a wear-induced weak erase mitigation process 800, as discussed further below in conjunction with FIG. 8, to apply a retirement policy for "wear" induced failures. Generally, upon a read error, the exemplary wear-induced weak erase mitigation process 800 determines if the erase fail bits per page exceeds a predefined page_defect_erase_fail_bits_threshold, then the wear-induced weak erase mitigation process 800 defects the page/pages. It is noted that defecting/retiring SSD cells provides a "permanent" mitigation by prohibiting any future use of the defected or retired SSD cells.

During step 540, the exemplary weak erase detection and mitigation process 500 implements a double erase fix mitigation process 900, as discussed further below in conjunction with FIG. 9, to apply a double erase fix for a weak erase failure. Generally, if the erase fail bits per page exceeds a predefined double_erase_fail_bits_threshold, then a second erase operation is performed to allow a deeper erase. As discussed further below, the double erase fix mitigation process 900 can optionally perform a permanent mitigation by marking a block to have a double erase operation performed on every erase (and then every future erase operation uses a double erase).

During step 550, the exemplary weak erase detection and mitigation process 500 implements an erase verify fix, as discussed further below in conjunction with FIGS. 10A and 10B, whereby the erase verify voltage is shifted in a negative direction using Test Modes to apply additional Erase Pulse(s) causing a deeper erase. As discussed further below, an erase verify fix mitigation process 1010 can optionally perform a permanent mitigation by marking a block to perform an updated erase verify on every erase operation (and then every future erase operation uses an updated erase verify).

Finally, during step 560, the exemplary weak erase detection and mitigation process 500 implements a page calibration for read failures. Generally, the page calibration performs an "R1" Read Level Calibration using a predetermined Vref Sweep Window on LSB page (or whichever Page Type corresponds to a Read level between an Erase state and an adjacent Program state, for different flash memory types) failures, as discussed further below in conjunction with FIG. 11.

Weak Erase Detection

Figure 6:
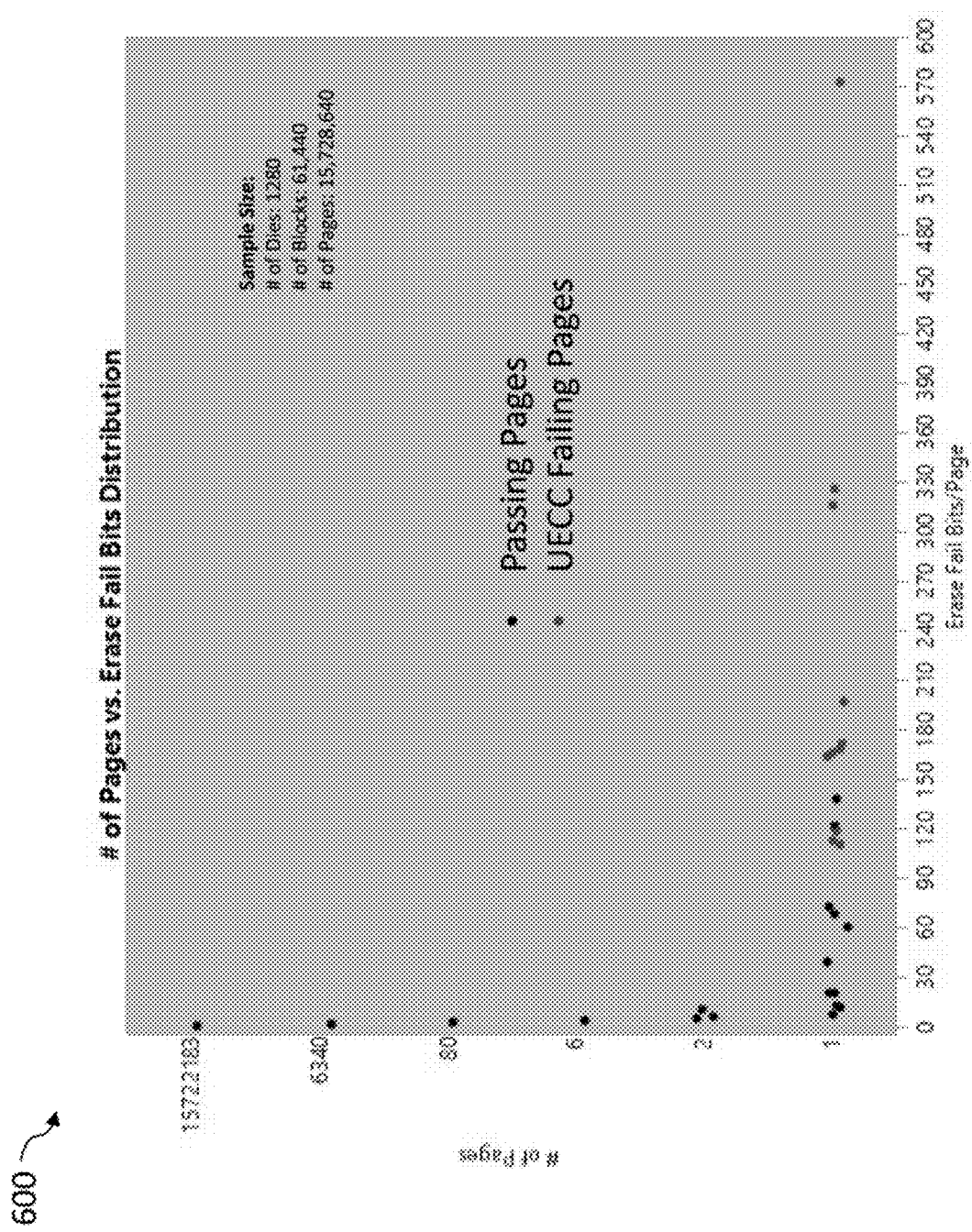
FIG. 6 illustrates a number of pages as a function of the erase fail bits distribution for detecting a weak erase condition, according to some embodiments.

FIG. 6 illustrates a number of pages as a function of the EFB distribution for detecting a weak erase condition, according to some embodiments. Generally, FIG. 6 illustrates passing pages compared to UECC failing pages. It has been found that weak erase impacted pages demonstrated significantly higher fail bits after an erase (e.g., prior to program) (referred to as erase fail bits), for example, on LSB Pages (or other page types impacted by the weak erase condition, such as whichever Page Type corresponds to a Read level between an Erase state and an adjacent Program state) when compared with pages without Weak Erase). It was found that all UECC failures were due to weak erase in the tested samples.

One or more aspects of the disclosure recognize that erase fail bits on LSB Pages can be used for detecting a weak erase prior to programming.

Weak Erase Mitigation

Figure 7:
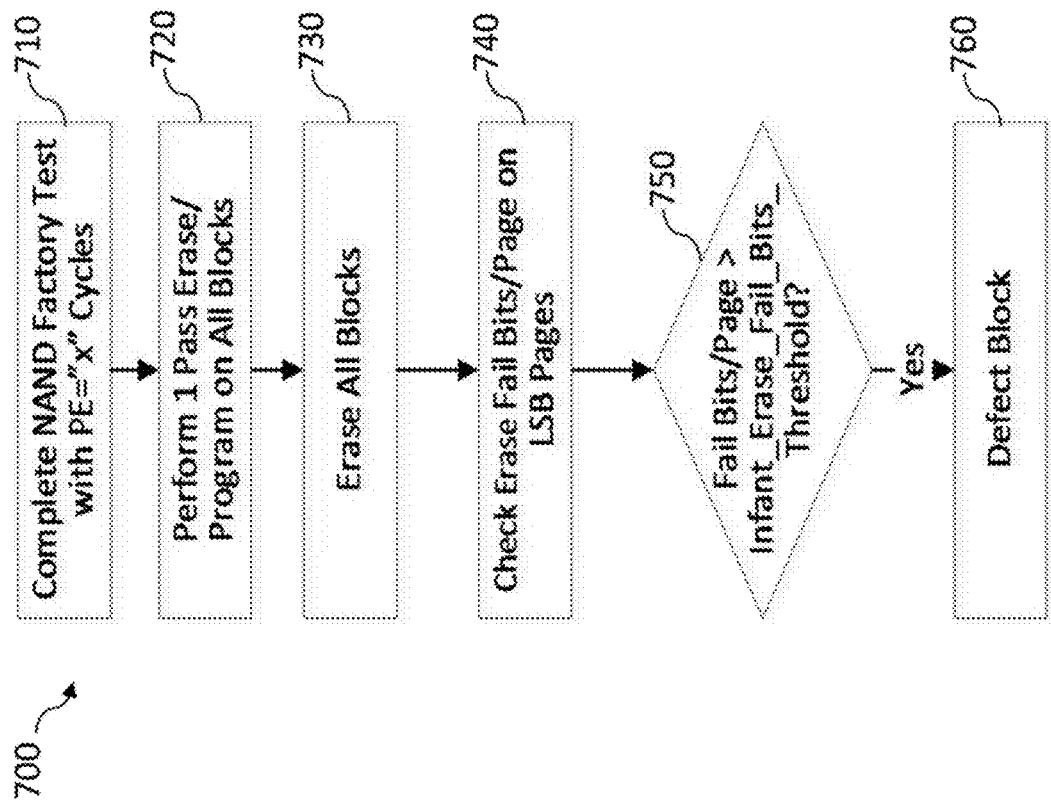
FIG. 7 is a flow chart illustrating an exemplary implementation of an infant mortality screening process, according to at least one embodiment of the disclosure.

FIG. 7 is a flow chart illustrating an exemplary implementation of an infant mortality screening process 700, according to at least one embodiment of the disclosure. As shown in FIG. 7, the exemplary infant mortality screening process 700 initially completes a NAND factory test during step 710 with program erase (PE) equal to "x" cycles. Thereafter, during step 720, a one pass erase/program is performed on all blocks of the SSD, and all blocks are then erased during step 730. The exemplary infant mortality screening process 700 checks the erase fail bits/page on LSB pages (for the exemplary NAND flash device type) during step 740. For other NAND types, the erase fail bits/page would be checked on pages corresponding to a read state adjacent to the erase state (e.g., MSB or CSB pages for different NAND types).

A test is performed during step 750 to determine if the fail bits/page exceeds a predefined infant_erase_fail_bits_threshold. When it is determined during step 750 that the fail bits/page exceeds the predefined infant_erase_fail_bits_threshold, then the block is defected during step 760. It is noted that the defect mitigation is applied at the block level during step 760, for example, before any user data is programmed to a flash location. In this manner, data loss is prevented.

Figure 8:
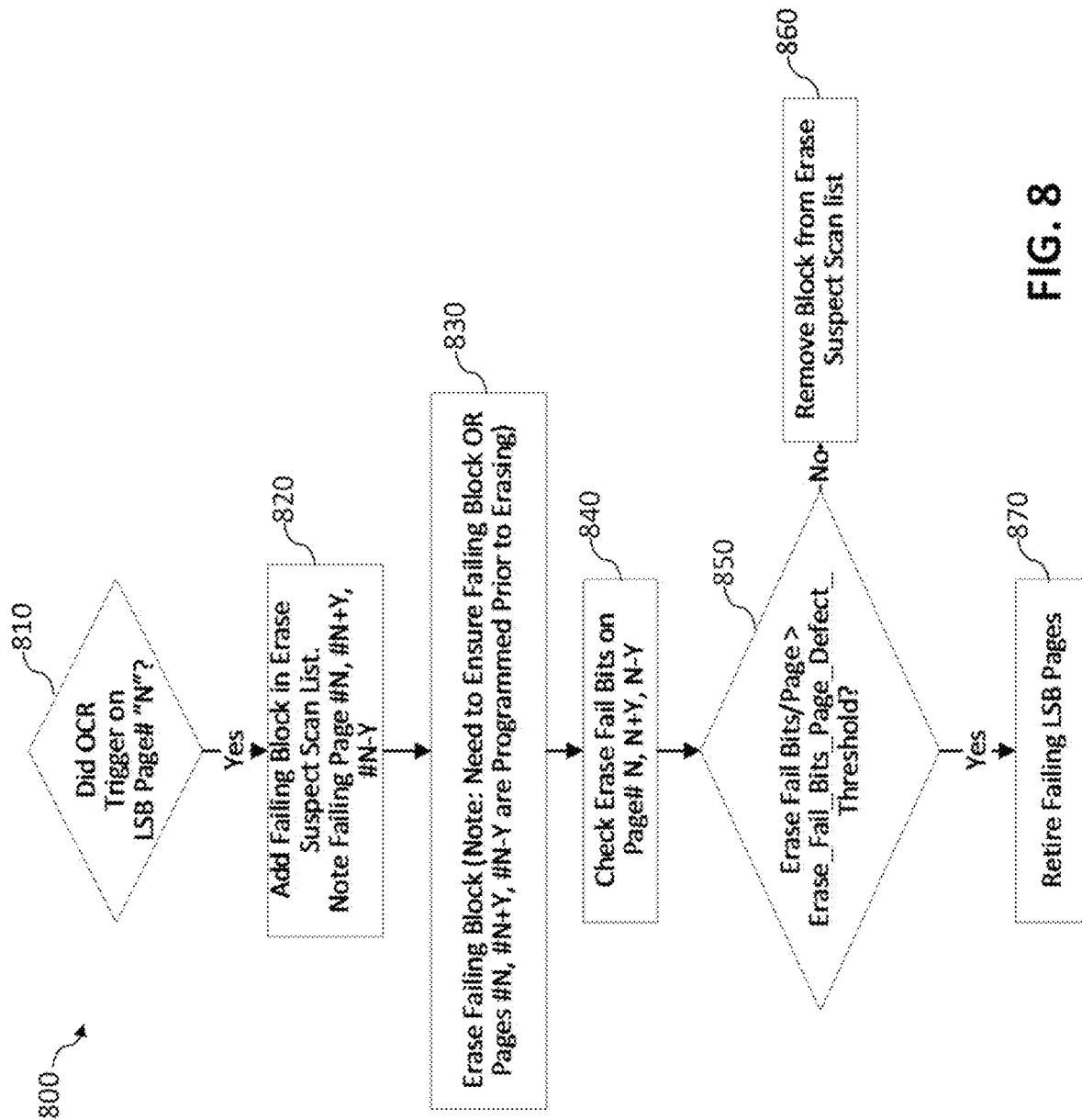
FIG. 8 is a flow chart illustrating an exemplary implementation of a wear-induced weak erase mitigation process, according to one embodiment of the disclosure.

FIG. 8 is a flow chart illustrating an exemplary implementation of a wear-induced weak erase mitigation process 800, according to at least one embodiment of the disclosure. As shown in FIG. 8, the exemplary wear-induced weak erase mitigation process 800 initially performs a test during step 810 to determine if the OCR triggered on LSB Page number "N". When it is determined during step 810 that the OCR triggered on LSB Page number "N," the failing block is added to an Erase Suspect Scan List during step 820. It is noted that the failing page number is N and N+Y and N−Y are two adjacent pages of the same page type as the failing page (where the value of "Y" depends on the particular 3D Flash Block Architecture). For example, for a failing LSB page, two adjacent LSB pages are also used. While LSB pages are considered in the exemplary embodiments, other Page Types may be impacted that correspond to a Read level between an Erase state and an adjacent Program state, as would be apparent to a person of ordinary skill in the art.

During step 830, the failing block is erased (ensuring that the failing block or Page numbers N, N+Y and N−Y are programmed prior to erasing). The erase fail bits are checked during step 840 on Page numbers N, N+Y and N−Y.

A test is performed during step 850 to determine if the fail bits/page exceeds a predefined erase_fail_bits_page_defect_threshold. If it is determined during step 850 that the fail bits/page exceeds the predefined erase_fail_bits_page_defect_threshold, then the failing LSB pages (or other appropriate page types for different NAND types, as described herein) are retired during step 870.

If, however, it is determined during step 850 that the fail bits/page do not exceed the predefined erase_fail_bits_page_defect_threshold, then the block is removed from the erase suspect scan list during step 860.

In this manner, defect mitigation is applied at the page level after a first occurrence of error, before a subsequent program, thereby preventing future data loss.

Figure 9:
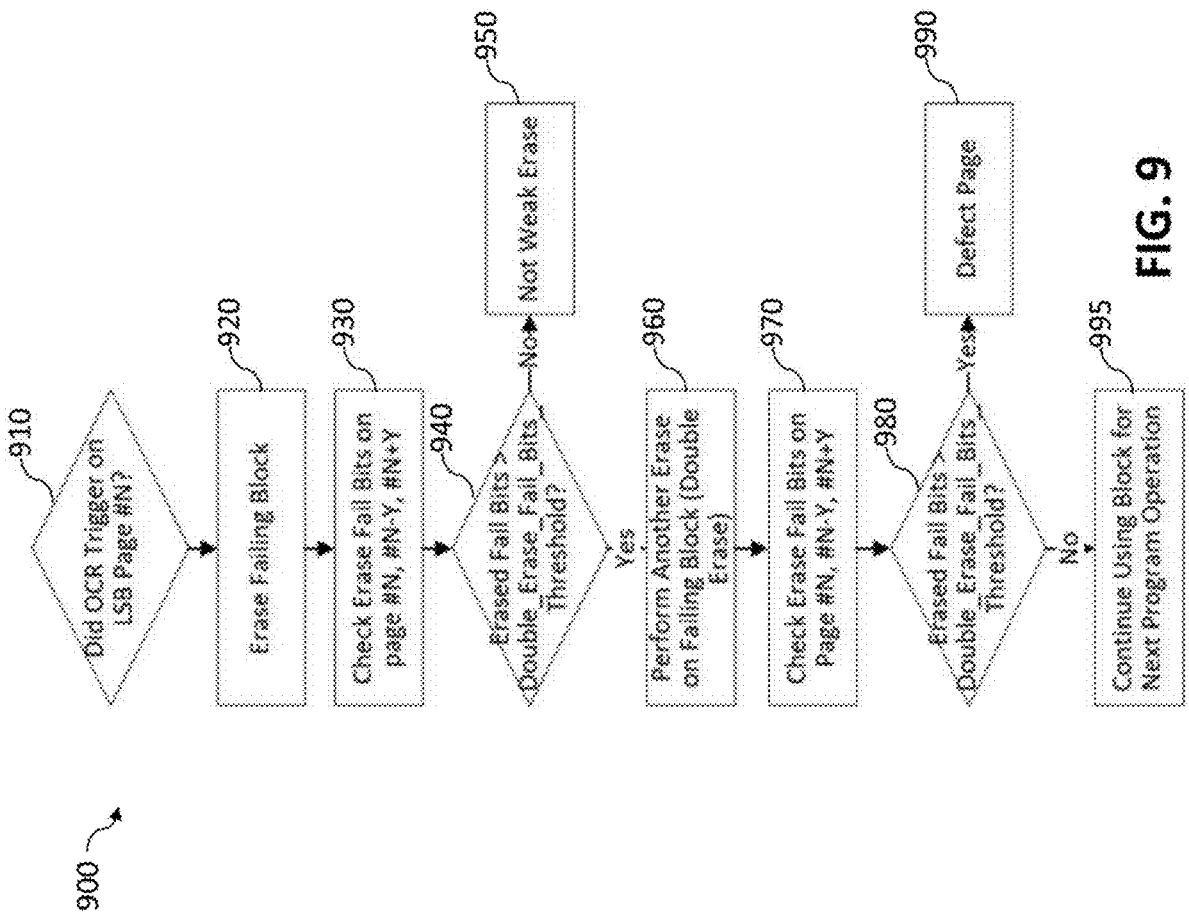
FIG. 9 is a flow chart illustrating an exemplary implementation of a double erase fix mitigation process, according to an embodiment.

FIG. 9 is a flow chart illustrating an exemplary implementation of a double erase fix mitigation process 900, according to an embodiment. As shown in FIG. 9, the exemplary double erase fix mitigation process 900 initially tests to determine if the OCR triggered on LSB page number N (for the exemplary NAND flash device type; or other pages susceptible to weak erase errors in other NAND device types), during step 910. While LSB pages are considered in the exemplary embodiments, other Page Types may be impacted that correspond to a Read level between an Erase state and an adjacent Program state, as would be apparent to a person of ordinary skill in the art.

When the OCR triggers on LSB Page number N during step 910, the failing block is erased during step 920, and the erase fail bits on the failing page (#N), and two adjacent pages of the same page type (#N−Y and #N+Y) are checked during step 930.

A test is performed during step 940 to determine if the erased fail bits exceeds a predefined double_erase_fail_bits_threshold. If it is determined during step 940 that the erased fail bits does not exceed the predefined double_erase_fail_bits_threshold, then the failing page is not due to a weak erase (step 950).

If it is determined during step 940 that the erased fail bits exceeds the predefined double_erase_fail_bits_threshold, then another erase operation is performed on the failing block during step 960 (e.g., a double erase), and the erase fail bits on the failing page (#N), and two adjacent pages of the same page type (#N−Y and #N+Y) are checked again during step 970.

A test is performed during step 980 to again determine if the erased fail bits exceeds a predefined double_erase_fail_bits_threshold. If it is determined during step 980 that the erased fail bits exceeds the predefined double_erase_fail_bits_threshold, then the failing page is defected during step 990.

If, however, it is determined during step 980 that the erased fail bits does not exceed the predefined double_erase_fail_bits_threshold, then the block can continue to be used during step 995 for the next program operation.

Among other benefits, the exemplary double erase fix mitigation process 900 applies defect mitigation at the page level after a first occurrence of an error, before a subsequent programming, thereby preventing future data loss.

As noted above, the double erase fix mitigation process 900 can optionally perform a permanent mitigation by marking a block to have a double erase on every erase operation (and then every future erase operation uses a double erase).

It is noted that in some embodiments the double_erase_fail_bits_threshold can be determined based on:

(1) a Transfer Function Between EFB and PFB;
(2) an ECC capability; and/or
(3) a required ECC margin.

Generally, if the double_erase_fail_bits_threshold is violated following the second erase operation, then the page is defected during step 990. If, however, the double_erase_fail_bits_threshold is not violated following the second erase operation, then the block can continue to be used for the next program operation during step 995.

In this manner, bad pages in the block are removed and the remaining pages can still be used after applying mitigation.

Figure 10A:
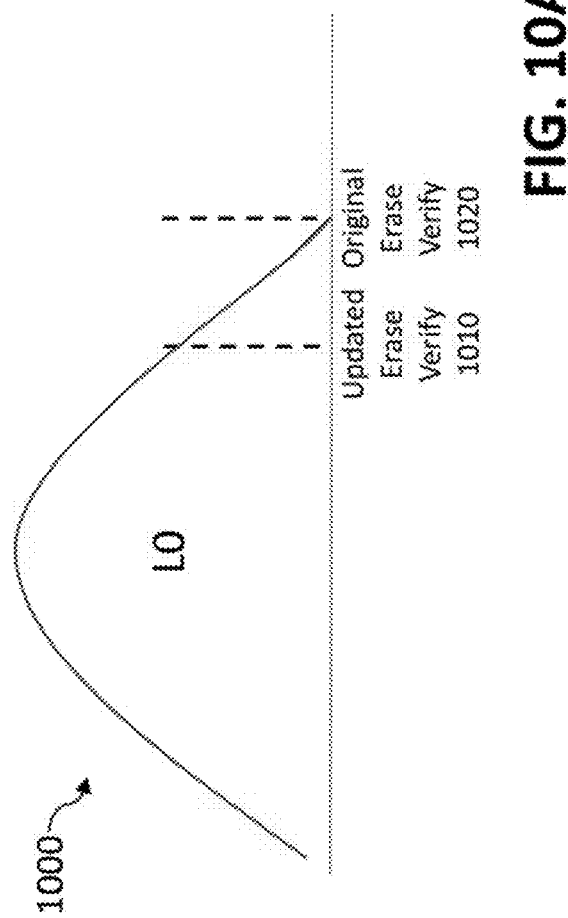
FIG. 10A illustrates a voltage distribution associated with an erase verify fix mitigation technique, according to some embodiments.

FIG. 10A illustrates a voltage distribution 1000 associated with an erase verify fix mitigation technique, according to some embodiments. As shown in FIG. 10A, the exemplary erase verify fix mitigation technique shifts an original erase verify voltage 1020 in a negative direction using Test Modes to an updated erase verify voltage 1010, to apply additional erase pulse(s) causing a deeper erase.

Generally, the exemplary erase verify fix mitigation technique mitigates at the page level after a first occurrence of a read failure, before a subsequent programming of the cells (since the cells are susceptible to weak erase failures), thereby preventing future data loss.

Figure 10B:
FIG. 10B is a flow chart illustrating an exemplary implementation of an erase verify fix mitigation process, according to one embodiment of the disclosure.

FIG. 10B is a flow chart illustrating an exemplary implementation of an erase verify fix mitigation process 1010, according to one embodiment of the disclosure. As shown in FIG. 10B, the exemplary erase verify fix mitigation process 1010 initially tests to determine if the RAID triggered on LSB page number N (for the exemplary NAND flash device type; or other pages susceptible to weak erase errors in other NAND device types), during step 1015. When the RAID triggers on LSB Page number N during step 1015, the failing block is erased during step 1020, and the erase fail bits on the failing page (#N), and two adjacent pages of the same page type (#N−Y and #N+Y) are checked during step 1030.

A test is performed during step 1040 to determine if the erased fail bits exceeds a predefined erase_verify_fail_bits_threshold. If it is determined during step 1040 that the erased fail bits does not exceed the predefined erase_verify_fail_bits_threshold, then the failing page is not due to a weak erase (step 1050).

If it is determined during step 1040 that the erased fail bits exceeds the predefined erase_verify_fail_bits_threshold, then the block is programmed with dummy data during step 1060, and the predetermined negative voltage shift is applied to the erase verify voltage during step 1070. The block is then erased during step 1080.

A test is performed during step 1090 to again determine if the erased fail bits exceeds a predefined erase_verify_fail_bits_threshold. If it is determined during step 1090 that the erased fail bits exceeds the predefined erase_verify_fail_bits_threshold, then the failing page is defected during step 1095.

If, however, it is determined during step 1090 that the erased fail bits does not exceed the predefined erase_verify_fail_bits_threshold, then the block can continue to be used during step 1098 for the next program operation.

Among other benefits, the exemplary erase verify fix mitigation process 1010 applies defect mitigation at the block level after a first occurrence of an error, before a subsequent programming, thereby preventing future data loss.

As noted above, the exemplary erase verify fix mitigation process 1010 can optionally perform a permanent mitigation by marking a block to performed an updated erase verify on every erase operation (and then every future erase operation uses the updated erase verify). It is noted that in some embodiments, the erase_verify_fail_bits_threshold can be the same or different than the double_erase_fail_bits_threshold, and can be determined during NAND characterization testing.

FIG. 11 illustrates voltage distributions 1100, 1150 associated with a page calibration mitigation technique for read failures, for a good erase operation and a weak erase operation, respectively, according to one or more embodiments of the disclosure. As noted above, the exemplary page calibration performs an "R1" read level calibration using a predetermined Vref Sweep Window on LSB page failures. Assume R1 is a read level between an Erase State (L0) and a Program State (L1), as shown in FIG. 11. It has been found that a weak erase condition impacts a page type that uses the R1 read level as one of the read levels during a page read.

Following a good or successful erase operation (associated with the voltage distribution 1100), a reference voltage, Vref, is employed. Following a weak erase condition (associated with the voltage distribution 1150), the exemplary page calibration mitigation technique for read failures performs a page calibration to determine a new calibrated reference voltage, Vref.

Generally, the exemplary page calibration mitigation technique salvages the data following a programming of the cells since the cells are susceptible to weak erase failures.

In some embodiments, the mitigation associated with the page calibration mitigation technique is applied at a page level on every occurrence of an error, thereby permitting data recovery.

Figure 12:
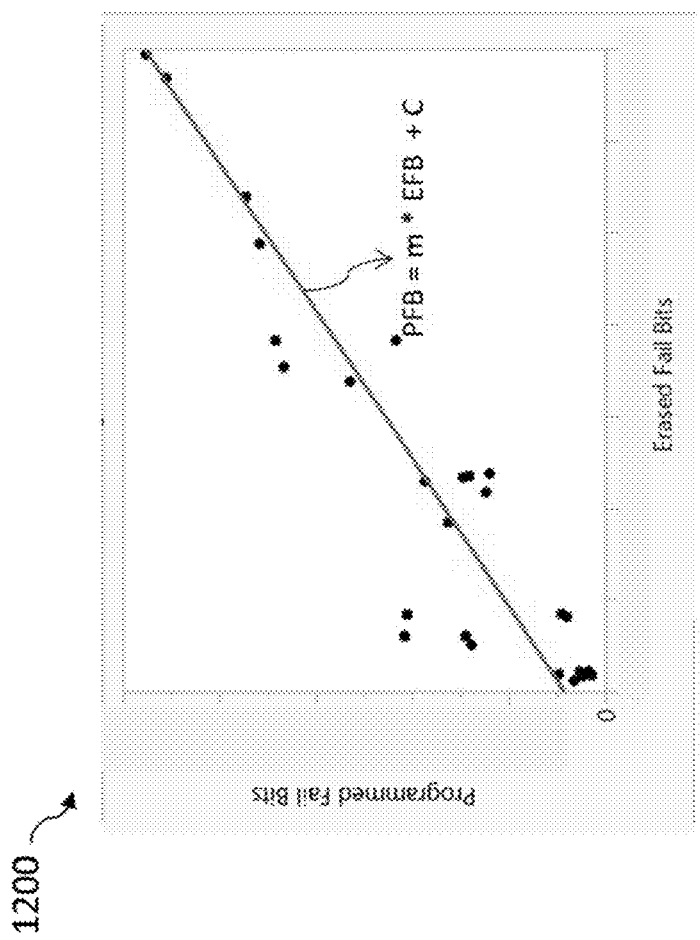
FIG. 12 illustrates an exemplary technique for determining erase fail bits thresholds, according to some embodiments.

FIG. 12 illustrates an exemplary technique 1200 for determining erase fail bits thresholds, according to some embodiments. In particular, FIG. 12 illustrates the PFB as a function of the EFB, with a relation of:

$$PFB=m*EFB+C, \qquad (i)$$

in some embodiments.

FIG. 13 illustrates exemplary pseudo code 1300 for a process for determining the erase fail bits thresholds in accordance with the techniques of FIG. 12, according to one embodiment of the disclosure. As shown in FIG. 13, the exemplary pseudo code 1300 initially determines the PFB as a function of the EFB, during step 1, for example, during component evaluation. Generally, the component evaluation needs to include "weak erase" samples.

In the example of FIG. 13, the PFB as a function of the EFB is a linear function, according to equation (i):

$$PFB=m*EFB+C,$$

where m and c are constants.

During step 2.A, an acceptable fail bits PFBFactory threshold is established, for example, based on a required infant mortality bit error rate (BER) and applicable ECC.

During step 2.B, an acceptable fail bits PFBRetirement threshold is established, for example, based on an applicable ECC during flash life.

During step 3, EFBFactory and EFBRetirement thresholds are determined by substituting the results of steps 2.A and 2.B in equation (i).

It is noted that the Double_Erase_Fail_Bits_Threshold can be the same or lower than the Page_Defect_Erase_Fail_Bits_Threshold. In addition, the above example of FIG. 12 shows a linear function between EFB and PFB, but a transfer function between EFB and PFB could be linear or non-linear, as would be apparent to a person of ordinary skill in the art.

If no correlation is found between EFB and PFB, the thresholds can be determined based on EFB observed on weak erase locations resulting into UECC. Finally, it is noted that a different method to determine the transfer function between two parameters is beyond the scope of the present disclosure.

In one or more embodiments of the disclosure, techniques are provided for read parameter prediction. It should be understood that the read parameter prediction techniques illustrated in FIGS. 1 through 13 are presented by way of illustrative example only, and should not be construed as limiting in any way. Numerous alternative configurations of system and device elements and associated processing operations can be used in other embodiments.

In at least some embodiments, the disclosed weak erase detections are performed only on weak erase impacted pages and/or page type (where the page type corresponds to a read level between an Erase state and an adjacent Program state) for a quicker detection and mitigation.

Illustrative embodiments disclosed herein can provide a number of significant advantages relative to conventional arrangements. For example, one or more embodiments provide a significantly improved mitigation for weak erase failures, including defecting or retiring blocks/pages or making the erase distribution deeper, to prevent read failures followed by a number of recovery steps.

It is to be appreciated that the particular advantages described above and elsewhere herein are associated with particular illustrative embodiments and need not be present in other embodiments. Also, the particular types of weak erase detection and mitigation features and functionality as illustrated in the drawings and described above are exemplary only, and numerous other arrangements may be used in other embodiments.

As mentioned previously, at least portions of the disclosed weak erase detection and mitigation system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

The disclosed weak erase detection and mitigation arrangements may be implemented using one or more processing platforms. One or more of the processing modules or other components may therefore each run on a computer, storage device or other processing platform element. A given such element may be viewed as an example of what is more generally referred to herein as a "processing device."

Figure 14:
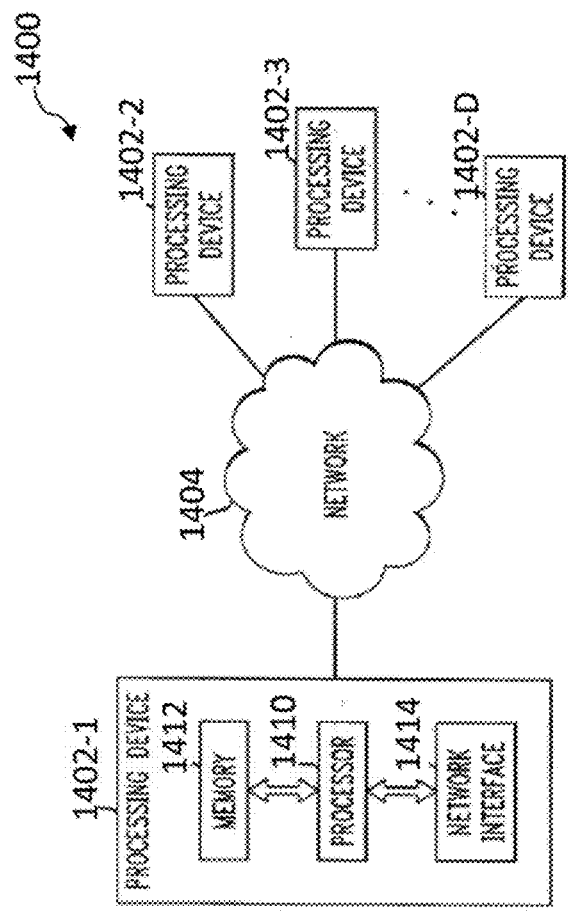
FIG. 14 illustrates a processing platform that may be used to implement at least a portion of one or more embodiments of the disclosure.

Referring now to FIG. 14, one possible processing platform that may be used to implement at least a portion of one or more embodiments of the disclosure is shown. The processing platform 1400 in this embodiment comprises at least a portion of the given system and includes at least one processing device(s), denoted 1402-1, 1402-2, 1402-3, . . . 1402-D, which communicate with one another over a network 1404. The network 1404 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 1402-1 in the processing platform 1400 comprises a processor 1410 coupled to a memory 1412. The processor 1410 may comprise a microprocessor, a microcontroller, an application specific integrated circuit (ASIC), a field programmable gate array (FPGA) or other type of processing circuitry, as well as portions or combinations of such circuitry elements. The memory 1412 may comprise random access memory (RAM), read only memory (ROM) or other types of memory, in any combination. The memory 1412 and other memories disclosed herein should be viewed as illustrative examples of what are more generally referred to as "processor-readable storage media" storing executable program code of one or more software programs.

Also included in the processing device 1402-1 is network interface circuitry 1414, which is used to interface the processing device with the network 1404 and other system components, and may comprise conventional transceivers.

The other processing devices 1402, if any, of the processing platform 1400 are assumed to be configured in a manner similar to that shown for processing device 1402-1 in the figure.

Again, the particular processing platform 1400 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 14, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 1400 shown in FIG. 14 is presented by way of example only, and the weak erase detection and mitigation system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the weak erase detection and mitigation system. Such components can communicate with other elements of the weak erase detection and mitigation system over any type of network or other communication media.

As indicated previously, components of an information processing system as disclosed herein can be implemented at least in part in the form of one or more software programs stored in memory and executed by a processor of a processing device. For example, at least portions of the functionality of the processes of FIGS. 5-13 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and weak erase detection and mitigation systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method of detecting weak erase failure in a storage media of a solid-state storage device, the method comprising steps of:

prior to a program operation of a portion of the storage media or after a read failure of the portion requiring an outer code, determining, by a controller of the solid-state storage device, an erase fail bits metric for the portion of the storage media;

detecting, by the controller, a permanent failure in the portion of the storage media of the solid-state storage device causing weak erase failure mode by determining that the erase fail bits metric for the portion of the storage media exceeds a predefined erase fail bits threshold; and upon detecting the permanent failure in the portion of the storage media of the solid-state storage device causing the weak erase failure mode, mitigating, by the controller, for the weak erase failure mode in the portion of the storage media of the solid-state storage device by performing one or more of:

defecting one or more blocks of the solid-state storage device when the erase fail bits metric exceeds a predefined factory erase fail bits threshold, the predefined factory erase fail bits threshold being based on a factory screening criteria, marking one or more pages of the solid-state storage device as defective when the erase fail bits metric exceeds a predefined page defect erase fail bits threshold, the predefined page defect erase fail bits threshold being based on a retirement policy for defective pages, performing two erase operations on one or more blocks of the solid-state storage device when the erase fail bits metric exceeds a predefined double erase fail bits threshold, the predefined double erase fail bits threshold being based on an error correction code capability criteria, shifting an erase verify voltage in a predefined direction to apply one or more additional erase pulses to one or more impacted blocks of the solid-state storage device, and performing a read voltage calibration for a read level between an erase state and adjacent program state of the solid-state storage device using a predefined reference voltage sweep for one or more failures on one or more pages impacted by the one or more failures.

2. The method of claim 1, wherein mitigating for the weak erase failure mode further comprises changing a status of one or more cells of the solid-state storage device to one or more of a defective state and a retired state at a page level resolution.

3. The method of claim 1, wherein detecting the permanent failure in the solid-state storage device causing the weak erase failure mode comprises detecting the weak erase failure mode without an erase failure.

4. The method of claim 1, wherein one or more of the predefined factory erase fail bits threshold, the predefined page defect erase fail bits threshold, and the predefined double erase fail bits threshold are obtained using a correlation between the erase fail bits metric and a programmed fail bits metric.

5. The method of claim 1, wherein the predefined factory erase fail bits threshold evaluates one or more of an infant mortality bit error rate and an applicable error correction code.

6. The method of claim 1, wherein the predefined page defect erase fail bits threshold evaluates an applicable error correction code during a life of the solid-state storage device.

7. The method of claim 1, wherein the predefined double erase fail bits threshold evaluates one or more of a correlation between the erase fail bits metric and a programmed fail bits metric and a required error correction code margin.

8. A tangible machine-readable recordable storage medium, containing one or more software programs that, when executed by the controller of the solid-state storage device, implement the steps of the method of claim 1.

9. A controller of a storage device, comprising:
a memory storing a weak erase detection and mitigation process; and
at least one processor coupled to the memory and to a solid-state storage media of the storage device, the weak erase detection and mitigation process operative to cause the at least one processor to:
prior to a program operation of a portion of the solid-state storage media or after a read failure of the portion requiring an outer code, determine an erase fail bits metric for the portion of the solid-state storage media,
detect a permanent failure in the portion of the solid-state storage media causing weak erase failure mode by determining that the erase fail bits metric for the portion of the solid-state storage media exceeds a predefined erase fail bits threshold, and
upon detecting the permanent failure in the portion of the solid-state storage media causing weak erase failure mode, mitigate for the weak erase failure mode in the portion of the solid-state storage media;
wherein mitigating for the weak erase failure mode in the portion of the solid-state storage media comprises one or more of:
defecting one or more blocks of the solid-state storage media when the erase fail bits metric exceeds a predefined factory erase fail bits threshold, the predefined factory erase fail bits threshold being based on a factory screening criteria,
marking one or more pages of the solid-state storage media as defective when the erase fail bits metric exceeds a predefined page defect erase fail bits threshold, the predefined page defect erase fail bits threshold being based on a retirement policy for defective pages,
performing two erase operations on one or more blocks of the solid-state storage media when the erase fail bits metric exceeds a predefined double erase fail bits threshold, the predefined double erase fail bits threshold being based on an error correction code capability criteria,
shifting an erase verify voltage in a predefined direction to apply one or more additional erase pulses to one or more impacted blocks of the solid-state storage media, and
performing a read voltage calibration for a read level between an erase state and adjacent program state of the solid-state storage media using a predefined reference voltage sweep for one or more failures on one or more pages impacted by the one or more failures.

10. The controller of claim 9, wherein mitigating for the weak erase failure mode comprises changing a status of one or more cells of the solid-state storage media to one or more of a defective state and a retired state at a page level resolution.

11. The controller of claim 9, wherein the detecting the permanent failure in the portion of the solid-state storage media causing the weak erase failure mode comprises detecting the weak erase failure mode without an erase failure.

12. A solid-state storage device comprising:
a non-volatile storage media; and
a controller operatively connected to the storage media and comprising a memory and a processor, the controller configured to perform the following steps:
prior to a program operation of a portion of the storage media or after a read failure of the portion requiring an outer code, determine an erase fail bits metric for the portion of the storage media,
detect a permanent failure in the portion of the storage media causing weak erase failures by determining that the erase fail bits metric for the portion exceeds a predefined erase fail bits threshold, and
upon detecting the permanent failure in the portion of the storage media causing the weak erase failures, mitigate effects of the weak erase failures in the portion of the storage media by performing one or more of:
changing a status of one or more cells of the solid-state storage device to one or more of a defective state and a retired state at a page level resolution,
performing two erase operations on one or more blocks of the storage media, and
performing an erase operation while shifting an erase verify voltage in a predefined direction to apply one or more additional erase pulses to one or more impacted blocks of the storage media.

* * * * *